(12) United States Patent
Lee et al.

(10) Patent No.: US 8,558,230 B2
(45) Date of Patent: Oct. 15, 2013

(54) THIN FILM TRANSISTOR SUBSTRATE AND METHOD OF FABRICATING THE SAME

(75) Inventors: Dong-Hoon Lee, Seoul (KR); Je-Hun Lee, Seoul (KR); Do-Hyun Kim, Seongnam-si (KR); Hee-Tae Kim, Yongin-si (KR); Chang-Oh Jeong, Suwon-si (KR); Pil-Sang Yun, Seoul (KR); Ki-Won Kim, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 373 days.

(21) Appl. No.: 12/756,323

(22) Filed: Apr. 8, 2010

(65) Prior Publication Data

US 2010/0276686 A1 Nov. 4, 2010

(30) Foreign Application Priority Data

Apr. 29, 2009 (KR) ........................ 10-2009-0037745

(51) Int. Cl.
*H01L 29/04* (2006.01)
*H01L 29/10* (2006.01)

(52) U.S. Cl.
USPC .............................. 257/49; 438/149; 438/158

(58) Field of Classification Search
USPC .......................................................... 257/43
See application file for complete search history.

(56) References Cited

U.S. PATENT DOCUMENTS

| 2008/0128689 A1* | 6/2008 | Lee et al. ................. 257/43 |
| 2008/0197350 A1* | 8/2008 | Park et al. ............... 257/43 |
| 2008/0318368 A1* | 12/2008 | Ryu et al. ............... 438/151 |

FOREIGN PATENT DOCUMENTS

| JP | 2004-273614 | 9/2004 |
| JP | 2007-165861 | 6/2007 |
| KR | 10-0858088 | 9/2008 |

* cited by examiner

*Primary Examiner* — Daniel Whalen
(74) *Attorney, Agent, or Firm* — H.C. Park & Associates, PLC

(57) ABSTRACT

A thin film transistor (TFT) substrate and a method of fabricating the same are provided. The thin film transistor substrate may have low resistance characteristics and may have reduced mutual diffusion and contact resistance between an active layer pattern and data wiring. The thin film transistor substrate may include gate wiring formed on an insulating substrate. Oxide active layer patterns may be formed on the gate wiring and may include a first substance. Data wiring may be formed on the oxide active layer patterns to cross the gate wiring and may include a second substance. Barrier layer patterns may be disposed between the oxide active layer patterns and the data wiring and may include a third substance.

10 Claims, 13 Drawing Sheets

THIN FILM TRANSISTOR SUBSTRATE AND METHOD OF FABRICATING THE SAME

CROSS REFERENCE TO RELATED APPLICATION

This application claims priority from and the benefit of Korean Patent Application No. 10-2009-0037745, filed on Apr. 29, 2009, which is hereby incorporated by reference for all purposes as if fully set forth herein.

BACKGROUND OF THE INVENTION

1. Field of the Invention

Exemplary embodiments of the present invention relate to a thin film transistor substrate and a method of fabricating the same. In particular, exemplary embodiments of the present invention relate to a thin film transistor substrate having low-resistance characteristics and having reduced mutual diffusion and contact resistance between an active layer pattern and data wiring.

2. Description of the Background

Liquid crystal displays (LCDs) are some of the most widely used flat panel displays. An LCD may include two substrates on which field-generating electrodes are formed, and a liquid crystal layer interposed between the substrates. A voltage may be applied to the electrodes to rearrange liquid crystal molecules of the LCD, thereby controlling the quantity of transmitted light.

Oxide active layer patterns with small leakage of photocurrent and reduced image sticking caused by deterioration of the TFT substrate due to visible light are actively being researched. Attempts to improve electrical properties of TFT substrates are also being made by reducing the resistance of wirings included in the TFT substrate.

To improve the electrical properties of TFT substrates, research into methods for reducing resistance between an oxide active layer pattern and data wiring is currently under way.

It is also beneficial to prevent mutual diffusion between the oxide film pattern and the data wiring and decrease contact resistance therebetween while maintaining low resistivity.

SUMMARY OF THE INVENTION

Exemplary embodiments of the present invention provide a thin film transistor (TFT) substrate having reduced mutual diffusion between the oxide film pattern and the data wiring, and decreased contact resistance therebetween while maintaining low resistivity.

Exemplary embodiments of the present invention also provide a method of fabricating the TFT substrate.

Additional features of the invention will be set forth in the description which follows, and in part will be apparent from the description, or may be learned by practice of the invention.

According to exemplary embodiments of the present invention, a TFT substrate includes gate wiring, oxide active layer patterns, data wiring, and barrier layer patterns. The gate wiring is disposed on a substrate. The oxide active layer patterns are disposed on the gate wiring. The oxide active layer patterns comprise a first substance. The data wiring is disposed on the oxide active layer patterns and crosses the gate wiring. The data wiring comprises a second substance. The barrier layer patterns are formed between the oxide active layer patterns and the data wiring. The barrier layer patterns comprise a third substance.

According to exemplary embodiments of the present invention, a TFT substrate includes gate wiring, oxide active layer patterns, data wiring, and barrier patterns. The gate wiring is disposed on a substrate. The oxide active layer patterns are disposed on the gate wiring. The oxide active layer patterns comprise a first substance. The data wiring is disposed on the oxide active layer patterns and crosses the gate wiring. The data wiring comprises a single layered structure comprising a second substance. The barrier patterns are formed to cover a top surface, a bottom surface, and lateral surfaces of the data wiring. The barrier patterns comprise a third substance.

According to exemplary embodiments of the present invention, a method of fabricating a thin film transistor substrate is disclosed. The method including disposing gate wiring on a substrate, and forming, on the gate wiring, oxide active layer patterns, data wiring, and barrier layer patterns. The oxide active layer patterns comprise a first substance. The data wiring comprises a second substance and crosses the gate wiring on the oxide active layer patterns. The barrier layer patterns comprise a third substance and are disposed between the oxide active layer patterns and the data wiring.

According to exemplary embodiments of the present invention, a method of fabricating a thin film transistor substrate is disclosed. The method including disposing gate wiring on a substrate, and forming, on the gate wiring, oxide active layer patterns, data wiring, and barrier layer patterns. The oxide active layer patterns comprise a first substance. The data wiring comprises a single layered structure comprising a second substance. The data wiring crosses the gate wiring on the oxide active layer patterns. The barrier layer patterns comprise an oxide of a third substance to cover a top surface, a bottom surface, and lateral surfaces of the data wiring.

It is to be understood that both the foregoing general description and the following detailed description are exemplary and explanatory and are intended to provide further explanation of the invention as claimed.

BRIEF DESCRIPTION OF THE ILLUSTRATED EMBODIMENTS

The accompanying drawings, which are included to provide a further understanding of the invention and are incorporated in and constitute a part of this specification, illustrate exemplary embodiments of the invention, and together with the description serve to explain the principles of the invention.

FIG. 3, FIG. 4, FIG. 5, FIG. 6, FIG. 7, FIG. 8, FIG. 9, FIG. 10, FIG. 11, FIG. 12, and FIG. 13 are cross-sectional views illustrating a method of fabricating a TFT substrate according to exemplary embodiments of the present invention.

Figure 12:
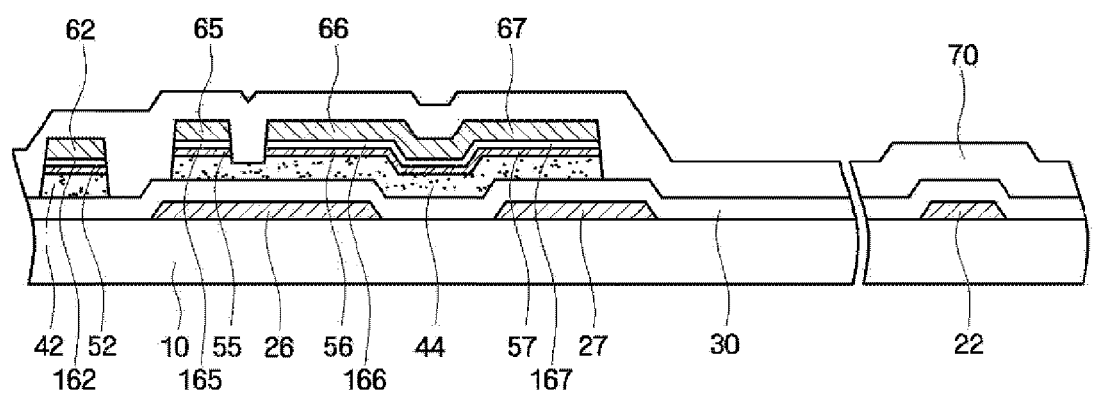
Figure 13:
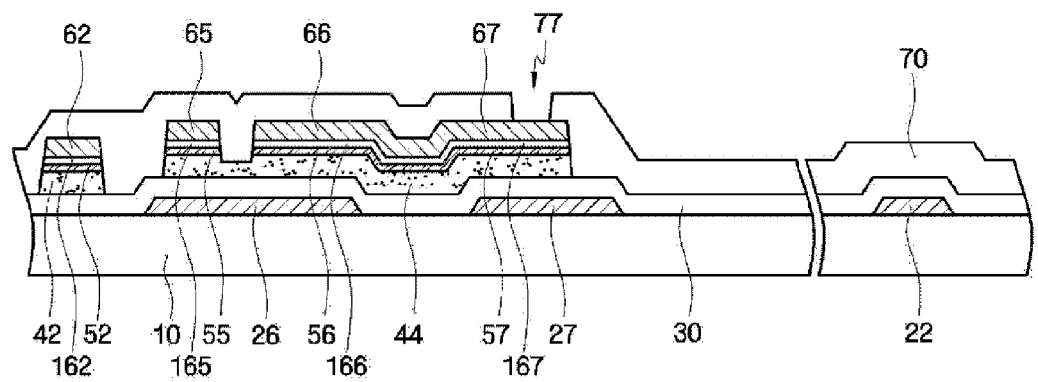
Figure 14A:
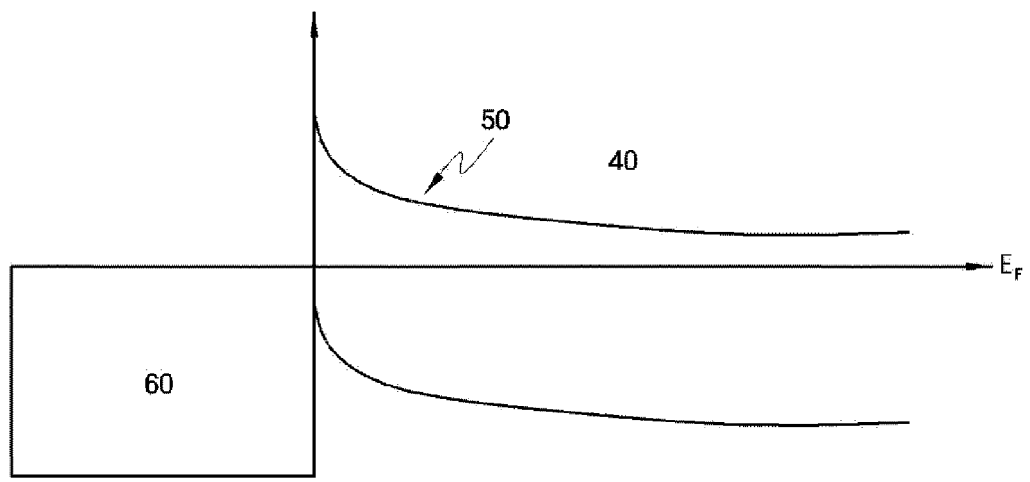
Figure 14B:
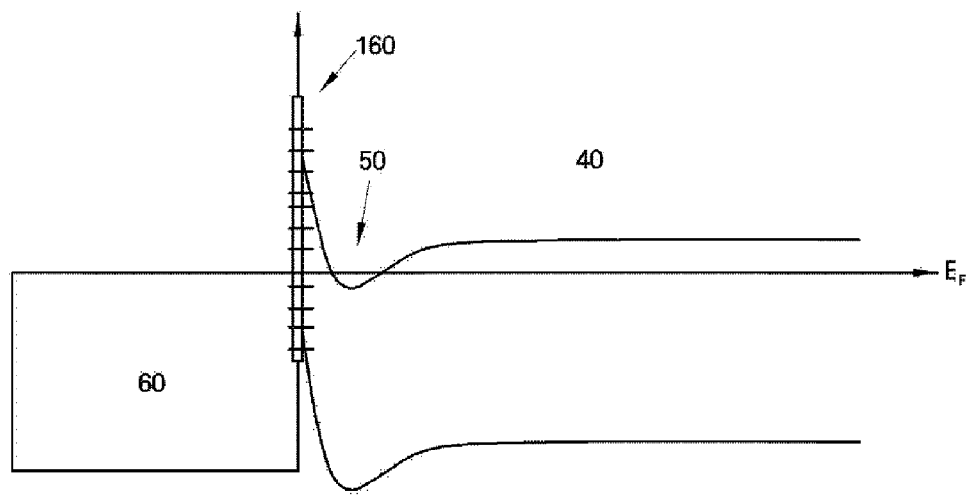

FIG. 14A and FIG. 14B are graphs illustrating changes in the energy band diagram occurring at the interface between devices before and after annealing in the fabricating process shown in FIG. 3, FIG. 4, FIG. 5, FIG. 6, FIG. 7, FIG. 8, FIG. 9, FIG. 10, FIG. 11, FIG. 12, and FIG. 13 according to exemplary embodiments of the present invention.

Figure 15:
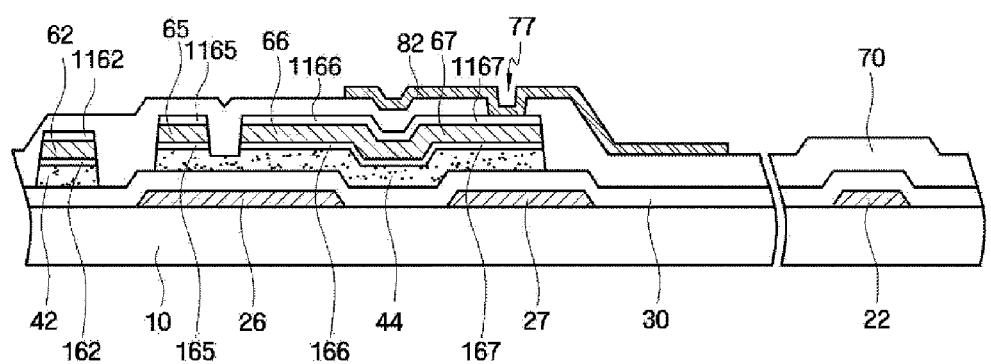

FIG. 15 is a cross-sectional view of a TFT substrate according to exemplary embodiments of the present invention.

Figure 16:
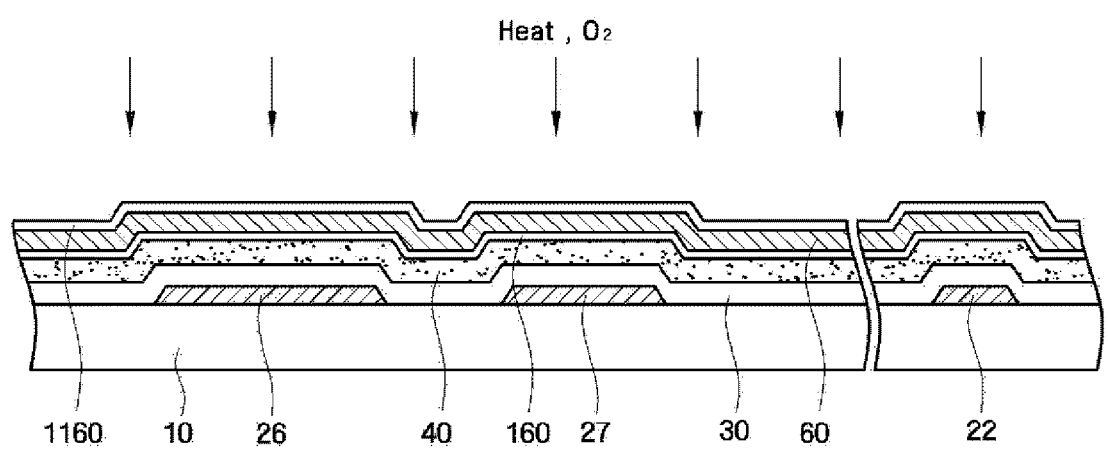

FIG. 16 is a cross-sectional view illustrating a method of fabricating a TFT substrate according to exemplary embodiments of the present invention.

Figure 17:
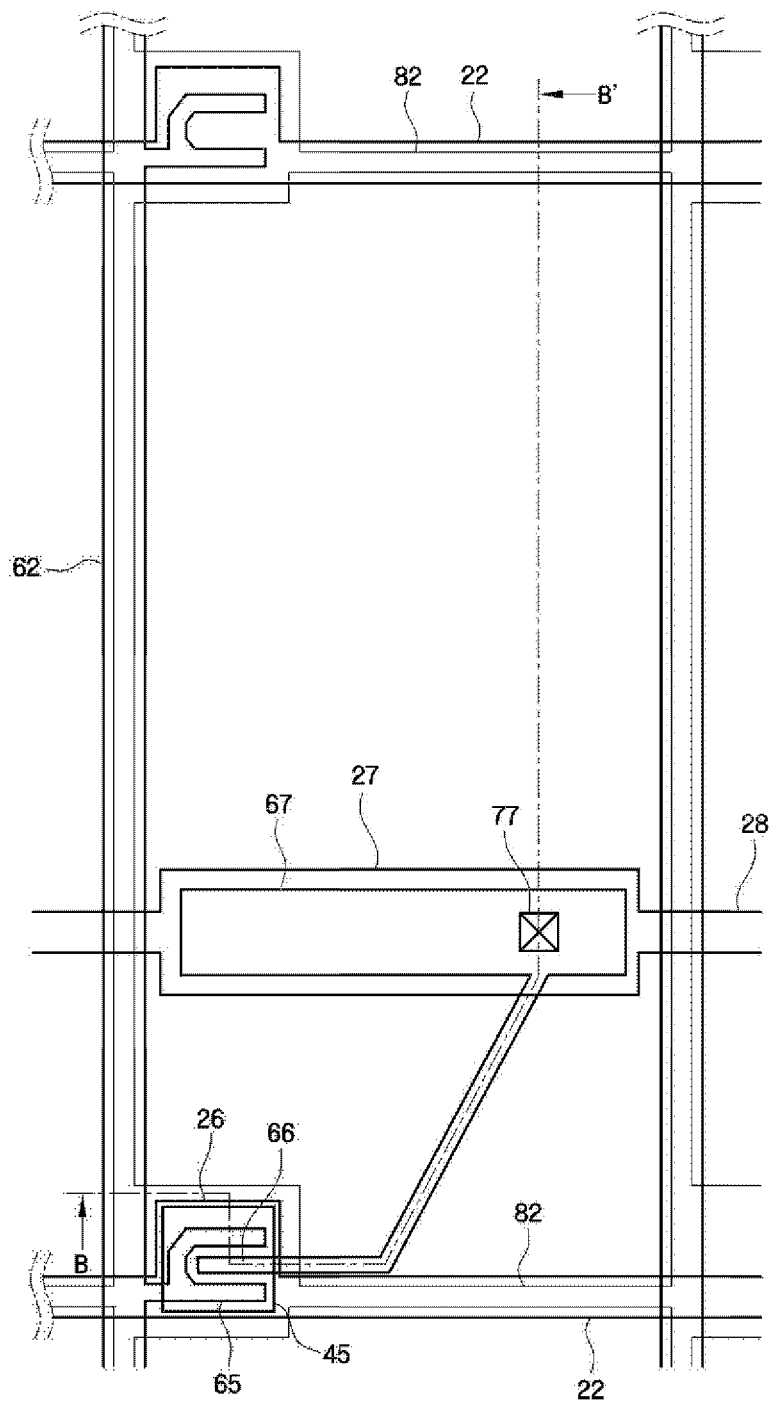

FIG. 17 is a layout view of a TFT substrate according to exemplary embodiments of the present invention.

Figure 18:
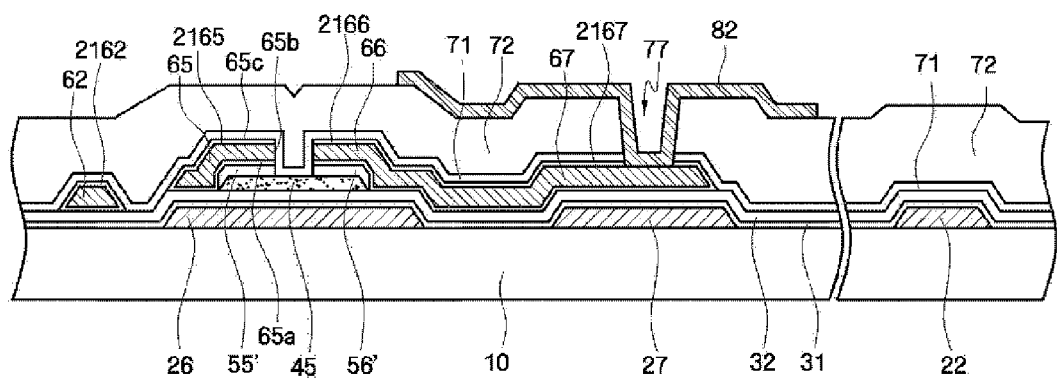

FIG. 18 is a cross-sectional view taken along line B-B' of the TFT substrate illustrated in FIG. 17 according to exemplary embodiments of the present invention.

Figure 19:
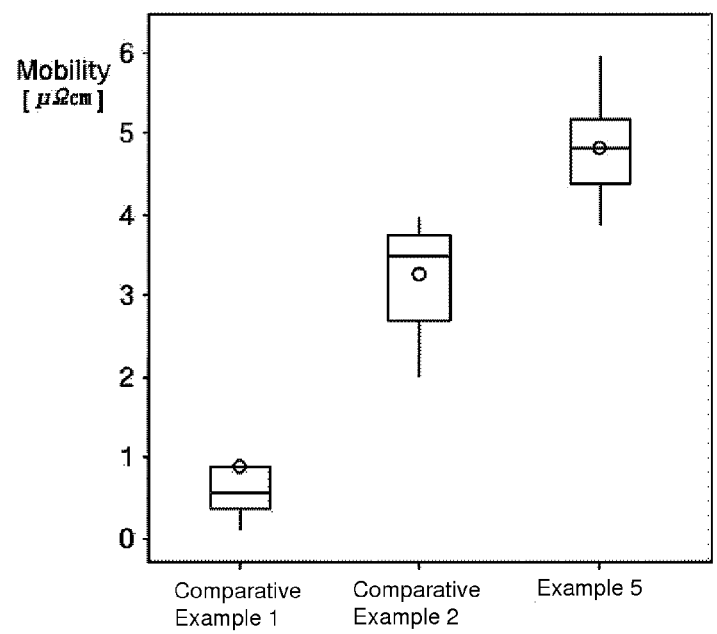
Figure 20:
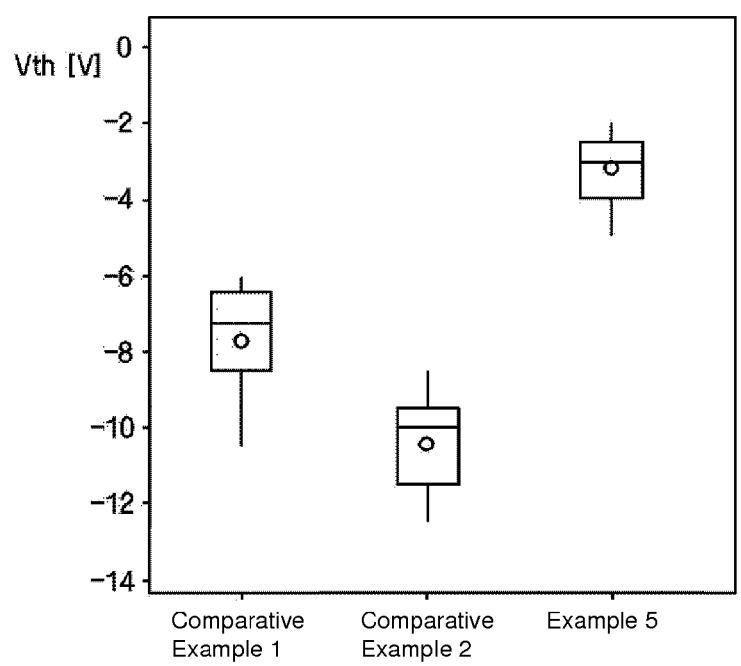

FIG. 19 and FIG. 20 are graphs for comparing electrical properties of TFT substrates according to exemplary embodiments of the present invention.

Figure 21:
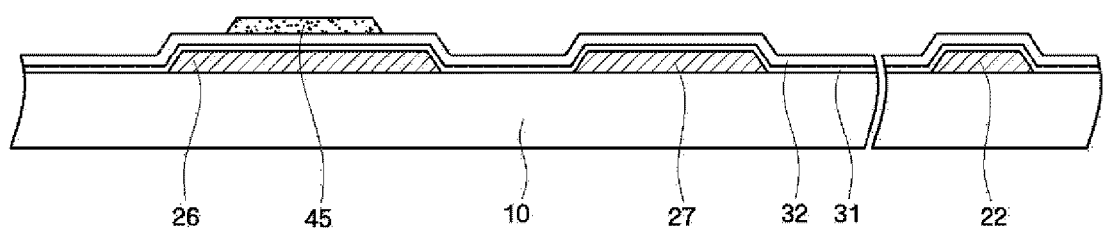
Figure 22:
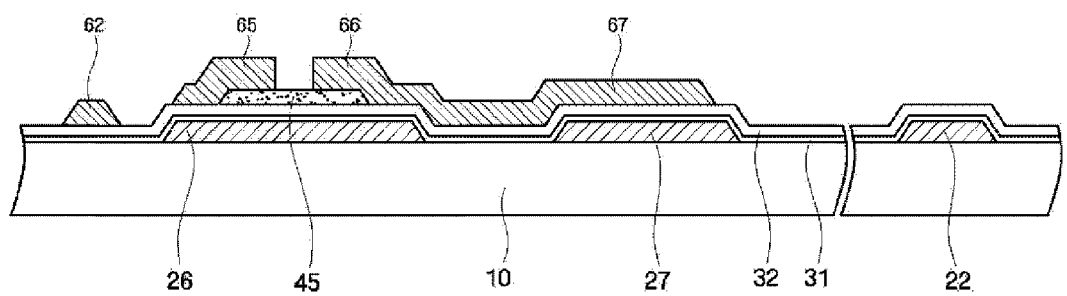
Figure 23:
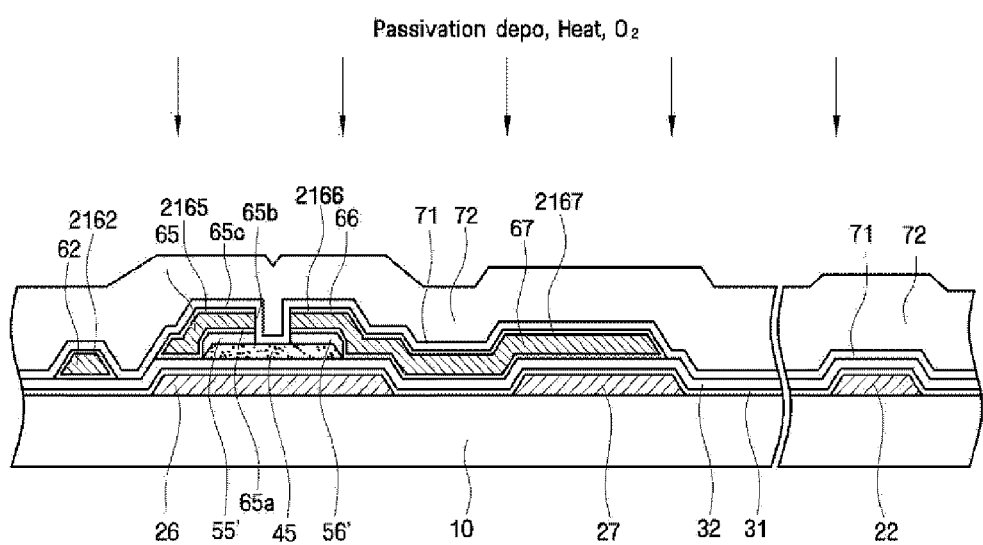

FIG. 21, FIG. 22, and FIG. 23 are cross-sectional views illustrating a method of fabricating a TFT substrate according to exemplary embodiments of the present invention.

DETAILED DESCRIPTION OF THE ILLUSTRATED EMBODIMENTS

Advantages and features of the exemplary embodiments and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete, and will fully convey the concept of the invention to those skilled in the art. In the drawings, the size and relative sizes of layers and regions may be exaggerated for clarity. Like reference numerals in the drawings denote like elements.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The terminology used in the description of the invention herein is for the purpose of describing particular embodiments only and is not intended to be limiting of the invention. The use of the terms "a," "an," and "the" and similar referents in the context of describing the invention (especially in the context of the following claims) are to be construed to cover both the singular and the plural, unless otherwise indicated herein or clearly contradicted by context. The terms "comprises," and "comprising" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, exemplary embodiments of the present invention are described in detail with reference to the accompanying drawings.

Figure 1:
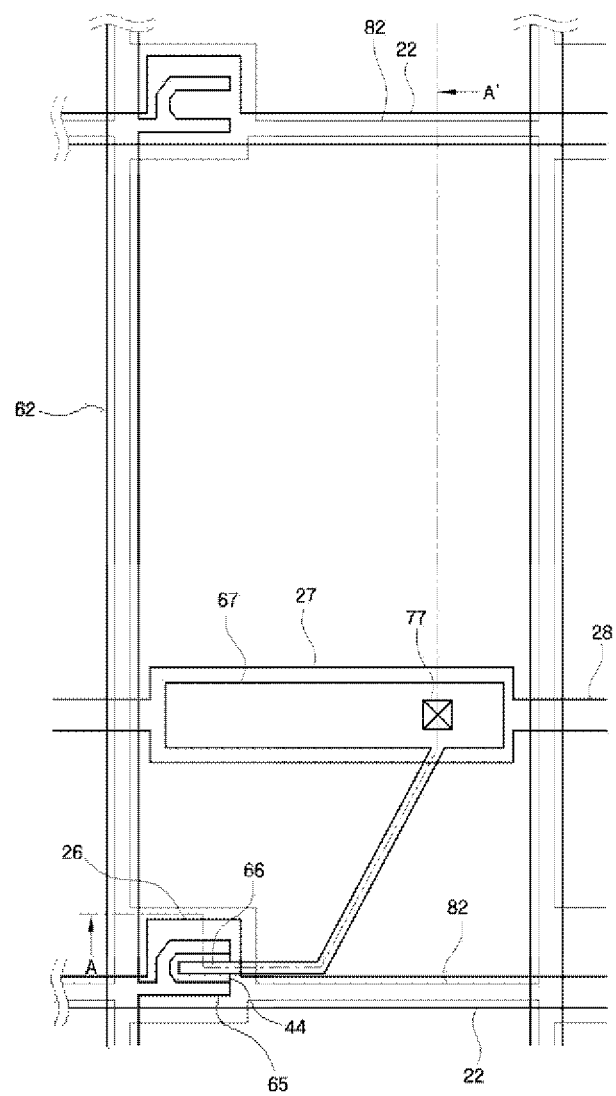
FIG. 1 is a layout view of a TFT substrate according to exemplary embodiments of the present invention.

A TFT substrate will be explained in detail with reference to FIG. 1 and FIG. 2. FIG. 1 is a layout view of a TFT substrate, and FIG. 2 is a cross-sectional view taken along line A-A' of the TFT substrate illustrated in FIG. 1 according to exemplary embodiments of the invention.

Figure 2:
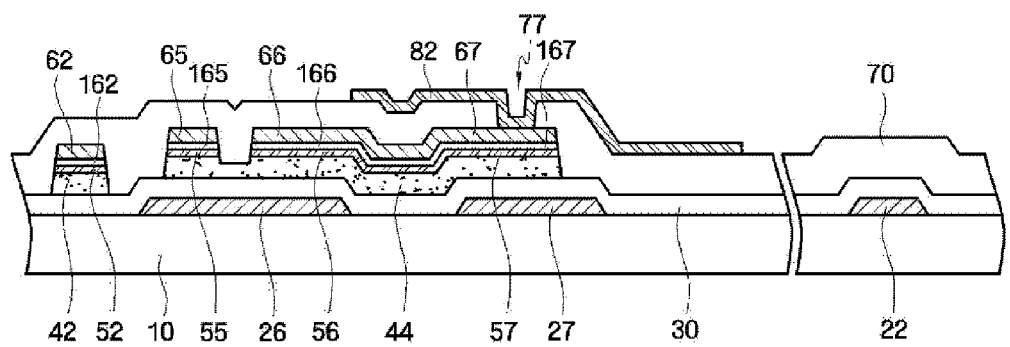
FIG. 2 is a cross-sectional view taken along line A-A' of the TFT substrate illustrated in FIG. 1 according to exemplary embodiments of the present invention.

Referring to FIG. 1 and FIG. 2, the TFT substrate may include various elements including a TFT formed on an insulating substrate 10.

The insulating substrate 10 may be formed of a glass substrate made of soda lime glass, borosilicate glass, or a plastic substrate. In general, the insulating substrate 10 may be made of any suitable material.

Gate wiring 22, 26, 27, and 28 may be formed on an insulating substrate 10 to transmit a gate signal. The gate wiring 22, 26, 27, and 28 may include a gate line 22 that extends in a transverse direction, and a gate electrode 26 of a thin film transistor that is connected to the gate line 22 to form a protrusion.

The gate wiring 22, 26, 27, and 28 may further include a storage electrode 27 and a storage electrode line 28 formed on the insulating substrate 10 to transmit a common voltage. The storage electrode line 28 may extend substantially parallel to the gate line 22 in a transverse direction. The storage electrode 27 may be wider than storage electrode line 28 and may overlap the drain electrode expanded part 67, which may be connected to a pixel electrode 82, as described in further detail below, to form a storage capacitor for improving the electric charge preservation ability of the pixel.

The shape and the position of the above-mentioned storage electrode 27 and the storage electrode line 28 may vary. In some cases, the storage electrode 27 and the storage electrode line 28 may not be formed if the storage capacitance generated due to the overlapping of the pixel electrode 82 and the gate line 22 is sufficiently high.

The gate wiring 22, 26, 27, and 28 may be made of an aluminum (Al)-based metal (e.g., Al, Al alloy), a silver (Ag)-based metal (e.g., Ag, Ag alloy), a copper (Cu)-based metal (Cu, Cu alloy), a molybdenum (Mo)-based metal (Mo, Mo alloy), chromium (Cr), titanium (Ti), or tantalum (Ta). In general, any suitable material may be used to form the gate wiring 22, 26, 27, and 28. Additionally, the gate wiring 22, 26, 27, and 28 may have a multilayered structure including two conductive films having different physical properties (not shown). Any one of the two conductive films may be formed of a metal having low resistivity. For example, the Al-based metal, the Ag-based metal, or the Cu-based metal may form the gate wiring 22, 26, 27, and 28 to reduce signal delay or a drop in voltage in the gate wiring 22, 26, 27, and 28. Another conductive film (i.e., second conductive film) may be formed of a substance having good contact properties with zinc oxide (ZnO), indium tin oxide (ITO), and indium zinc oxide (IZO). For example, a Mo-based metal, Cr, Ti, or Ta may form the second conductive film. For example, an exemplary combination of the multilayered gate wiring may include a lower layer of chromium and an upper layer of aluminum. It should be understood that alternative exemplary embodiments of the present invention are not limited thereto. For example, a multilayered gate wiring structure may include a lower Al layer and an upper Mo layer may be formed. In general, the gate wiring 22, 26, 27, and 28 may include various metals and conductors.

A gate insulating layer 30 made of silicon oxide ($SiO_x$) or silicon nitride ($SiN_x$) may be formed on the insulating substrate 10 and the gate wiring 22, 26, 27, and 28.

Oxide active layer patterns 42 and 44 including a first substance may be formed on the gate insulating layer 30.

The term 'active' in oxide active layer patterns may be used to describe an active substance having electrical characteristics when a drive current is applied to the oxide active layer patterns 42 and 44. The oxide active layer patterns 42 and 44 may include either a semiconductor or a metallic oxide substance. The oxide active layer patterns 42 and 44 may be oxide patterns comprising the first substance. The first substance may include one or more elements selected from the group consisting of Zn, In, Tin (Sn), Gallium (Ga), and Hafnium (Hf). The oxide active layer patterns 42 and 44 may be obtained by doping or alloying the first substance with Group II, III, XII, XIV, or XV elements of the periodic table. For example, the oxide active layer patterns 42 and 44 may include first substance oxides such as InZnO, InGaO, InSnO, ZnSnO, GaSnO, GaZnO, GaZnSnO, GaInZnO, HfInZnO, ZnO, and dopants and alloys of these elements.

The oxide active layer patterns 42 and 44 may further include nitride (e.g., nitrogen (N)-based compound), and may be referred to as nitride active layer patterns, which may be made of a first substance nitride, for example, GaN. In some cases, the nitride active layer patterns may only be made of the first substance nitride.

The oxide active layer patterns 42 and 44 may have superior semiconducting characteristics, including high effective mobility of charge carriers (e.g., 2 to 100 times greater than that of hydrogenated amorphous silicon), and a desirably large on/off current ratio in a range of $10^5$ to $10^8$. In addition, the oxide active layer patterns 42 and 44 may have a sufficiently large band gap of about 3.0 to 3.5 eV so that exposure to visible light does not cause leakage of photocurrent. Accordingly, instantaneous image sticking of an oxide TFT transistor can be prevented. Furthermore, it is not necessary to form a light blocking film under the oxide TFT transistor, thereby increasing the aperture ratio of the TFT substrate. Since the oxide active layer patterns 42 and 44 have high effective mobility and are capable of utilizing the conventional fabricating process suited for amorphous materials, they can be applied to large-size display devices.

The oxide active layer patterns 42 and 44 and the data wiring 62, 65, 66, and 67 may, in some cases, have the same shape, or, in other cases, have different shapes. For example, in some cases, the oxide active layer patterns 42 and 44 may be formed on an overlapping portion of the gate electrode 26, the source electrode 65, and the drain electrode 66. In some cases, the oxide active layer patterns 42 and 44 and the data wiring 62, 65, 66, and 67 may have substantially the same shape (e.g., linear), except in the channel regions of the TFT.

Ohmic contact layer patterns 52, 55, 56, and 57 may be formed over the oxide active layer patterns 42 and 44 between the oxide active layer patterns 42 and 44 and barrier layer patterns 162, 165, 166, and 167, which shall be described in further detail below. The ohmic contact layer patterns 52, 55, 56, and 57 may be formed by removing, at least partially, oxygen ions in the oxide active layer patterns 42 and 44. The ohmic contact layer patterns 52, 55, 56, and 57 may reduce contact resistance between the data wiring 62, 65, 66, and 67 and the oxide active layer patterns 42 and 44. The ohmic contact layer patterns 52, 55, 56, and 57 may be patterned in conformity with the shape of the data wiring 62, 65, 66, and 67. Ohmic contact layer patterns 55 and 56 may be spaced apart from and opposite to each other. The spaced-apart ohmic contact layer patterns 55 and 56 may have similar patterns as the source electrode 65 and the drain electrode 66 patterns.

The ohmic contact layer patterns 52, 55, 56, and 57 may be made of substantially the same material as the oxide active layer patterns 42 and 44. Since oxygen vacancy can increase carriers, the ohmic contact layer patterns 52, 55, 56, and 57 may be electrically conductive and may have increased carriers due to oxygen vacancy, thereby reducing contact resistance between the data wiring 62, 65, 66, and 67 and the oxide active layer patterns 42 and 44.

In some cases, when the contact resistance between the data wiring 62, 65, 66, and 67 and the oxide active layer patterns 42 and 44 is negligibly small, the ohmic contact layer patterns 52, 55, 56, and 57 may not be formed.

Barrier layer patterns 162, 165, 166, and 167 may include a second substance oxide and a third substance oxide, and may be formed on the ohmic contact layer patterns 52, 55, 56, and 57. The second substance oxide may be a low resistivity metal. For example, the barrier layer patterns 162, 165, 166, and 167 may include the third substance as a main component oxide, and may further include the second substance. The third substance's Oxide formation free energy ($\Delta Gf$) may be smaller than that of the first substance or the second substance, which shall be described in further detail below.

The barrier layer patterns 162, 165, 166, and 167 may prevent mutual diffusion between the data wiring 62, 65, 66, and 67 and the oxide active layer patterns 42 and 44. For example, to achieve low resistivity wiring, the data wiring 62, 65, 66, and 67 may be formed directly on the oxide active layer patterns 42 and 44. In such cases, mutual diffusion between the data wiring 62, 65, 66, and 67 and the oxide active layer patterns 42 and 44 may occur, causing increased resistance to the data wiring 62, 65, 66, and 67 or reduced mobility of the oxide active layer patterns 42 and 44. However, the barrier layer patterns 162, 165, 166 and 167 are capable of preventing mutual diffusion between the data wiring 62, 65, 66, and 67 and the oxide active layer patterns 42 and 44, thereby providing improved mobility in the TFT substrate while achieving low resistivity wiring.

The data wiring 62, 65, 66, and 67 may be formed on the barrier layer patterns 162, 165, 166, and 167. The data wiring 62, 65, 66, and 67 may include the second substance and the third substance, and may be made of alloys of the second substance and the third substance. The second substance may be made of a low resistivity material, for example, Ag, Al, or Cu. The third substance may be one or more elements selected from the group consisting of Vanadium (V), Zirconium (Zr), Ti, Ta, Manganese (Mn), Magnesium (Mg), Cr, Mo, Cobalt (Co), and Niobium (Nb). In general, any suitable material may be used for the second substance and the third substance.

To maintain low resistivity, about 96% to 99% of the data wiring 62, 65, 66, and 67 may be the second substance and about 1% to 4% of the data wiring 62, 65, 66, and 67 may be the third substance.

The data wiring 62, 65, 66, and 67 may have a single layered structure including an alloy of the second substance and the third substance. The data wiring 62, 65, 66, and 67 may further include an oxygen (O), hydrogen (H), or N element.

As described above, to form the barrier layer patterns 162, 165, 166, and 167, the oxide formation free energy of the third substance should be smaller than that of the first substance or the second substance. The oxide formation free energy levels of the respective substances are listed in TABLE 1.

TABLE 1

| | | ΔGf (at 298k): kJ/mol | | ΔGf (at 298k): kJ/mol |
|---|---|---|---|---|
| First substance oxide | ZnO | −324 | $Zn_3N_2$ | 39.3 |
| | $In_2O_3$ | −830 | InN | 15.6 |
| | $Ga_2O_3$ | −998 | GaN | −77.7 |
| | $SnO_2$ | −520 | | |
| Second substance oxide | $Al_2O_3$ | −1492 | AlN | −286.997 |
| | CuO | −128 | | |
| | $Cu_2O$ | −147 | | |
| | $Ag_2O$ | −11.2 | | |
| Third substance oxide | $V_2O_5$ | −1419 | VN | −191 |
| | $TiO_2$ (Rutile) | −889.406 | TiN | −309.155 |
| | $TiO_2$ (Anatase) | −883.266 | | |
| | $Ta_2O_5$ | −1910.991 | TaN | −226.575 |
| | $Co_3O_5$ | −794.901 | | |
| | $MoO_3$ | −667.993 | $Mo_2N$ | −54.81 |
| | $Nb_2O_5$ | −1765 | $Nb_2N$ | −220 |
| | $Mn_2O_3$ | −881.114 | $Mn_4N$ | −104.527 |
| | $ZrO_2$ | −1039.724 | ZrN | −336 |
| | MgO | −568.943 | $Mg_3N_2$ | −400.498 |
| | $Cr_2O_3$ | −1058.067 | $Cr_2N$ | −102 |

Since VN or $MO_2N$ has relatively high oxide free energy, the VN or $MO_2N$ may not be suitable to be used as the third substance of the data wiring 62, 65, 66, and 67.

The data wiring 62, 65, 66, and 67 may include data line 62 that crosses the gate line 22 in a longitudinal direction to define the pixel, the source electrode 65 that extends to an upper part of the oxide active layer patterns 42 and 44, and the drain electrode 66 that is separated from the source electrode 65.

The drain electrode 66 may be formed on upper parts of the oxide active layer patterns 42 and 44 opposite to the source electrode 65 with respect to the channel region of the TFT. The drain electrode pad 67 may extend from the drain electrode 66 to overlap the storage electrode 27, and may have a large area. The source electrode 65 may overlap at least a portion of the oxide active layer patterns 42 and 44. The drain electrode 66 may face the source electrode 65 with respect to the channel region of the TFT, and may overlap at least a portion of the oxide active layer patterns 42 and 44. While the data wiring 62, 65, 66, and 67 has been described, by way of example, to have a single layered structure including an alloy of the second substance and the third substance, it should be understood that the data wiring 62, 65, 66, and 67 is not limited to the single layered structure described herein. For example, in some cases, the data wiring 62, 65, 66, and 67 may have a double layered structure including a first layer having a single layered structure including an alloy of the second substance and the third substance, and a second layer including the second substance formed on the first layer. In some cases, the data wiring 62, 65, 66, and 67 may have a triple layered structure including a third layer in addition to the first and second layers described above. The third layer may be formed on the double layered structure including an alloy of the second substance and the third substance. The data wiring 62, 65, 66, and 67 having the double layered structure can reduce resistance, and the data wiring 62, 65, 66, and 67 having the triple layered structure can improve stability.

A passivation layer 70 may be formed on the data wiring 62, 65, 66, and 67 and the oxide active layer patterns 42 and 44. The passivation layer 70 may include an organic film to prevent the second substance, which is a low resistivity material in the data wiring 62, 65, 66, and 67, from reacting with an inorganic film, which is a low resistivity material made of, for example, silicon nitride, thereby preventing resistance therebetween.

In order to improve an aperture ratio of the TFT substrate, the gate wiring 22, 26, 27, and 28 and the data wiring 62, 65, 66, and 67 may be made of a transparent conductive material, such as ITO, IZO, or Al-doped zinc oxide (AZO).

A contact hole 77 may be formed in the passivation layer 70 to expose the drain electrode pad 67. A pixel electrode 82 may be formed on the passivation layer 70 to be electrically connected to the drain electrode pad 67 and to have a position corresponding to the pixel.

The pixel electrode 82 may be made of a transparent conductor, such as ITO, IZO, or a reflective conductor, such as Al. The pixel electrode 82 may be electrically connected to the drain electrode pad 67 through the contact hole 77. The pixel electrode 82 may receive data voltage, and may generate an electric field in conjunction with a common electrode (not shown) of a color filter substrate (not shown). The generated electric field may rotate the liquid crystal molecules of a liquid crystal layer (not shown) between the TFT substrate and the color filter substrate.

Hereinafter, a method of fabricating a TFT substrate according to exemplary embodiments of the present invention will be described in detail with reference to FIG. 1 through FIG. 14B. FIG. 3, FIG. 4, FIG. 5, FIG. 6, FIG. 7, FIG. 8, FIG. 9, FIG. 10, FIG. 11, FIG. 12, and FIG. 13 are cross-sectional views illustrating a method of fabricating a TFT substrate. FIG. 14A and FIG. 14B are graphs illustrating changes in the energy band diagram occurring at the interface between devices before and after annealing in the fabricating process shown in FIG. 3 through FIG. 13.

In the following description, the same reference numerals may be used for components having the same function as components described above with reference to FIG. 1 and FIG. 2. Descriptions for like components will not be repeated.

Figure 3:
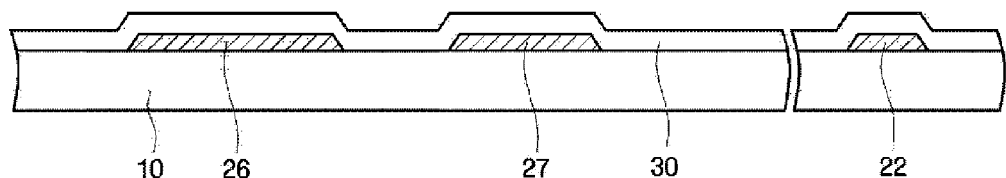

First, as shown in FIG. 1 and FIG. 3, a metal layer for gate wiring (not shown) is formed on the insulating substrate 10, and then patterned to provide the gate wiring 22, 26, 27, and 28 (i.e., the gate line 22, the gate electrode 26, the storage electrode 27, and the storage line 28).

A sputtering process may be used to form the gate wiring 22, 26, 27, and 28. The sputtering process may be performed at a low temperature of 200° C. or below, thereby preventing deterioration of the insulating substrate 10. Subsequently, the metal conductive films may be patterned by wet etching or dry etching. In the wet etching, an etchant that contains a phosphoric acid, a nitric acid, and/or an acetic acid may be used.

Subsequently, the gate insulating layer 30 may be deposited on the insulating substrate 10 and the gate wiring 22, 26, 27, and 28 using, for example, plasma-enhanced chemical vapor deposition ("PECVD") or reactive sputtering. A gate insulating layer 30 made of silicon nitride ($SiN_x$), silicon oxide (SiOx), silicon oxynitride (SiON), or SiOC, may be formed by PECVD. A gate insulating layer 30 made of $SiN_x$, SiOx, or SiON may also be formed by reactive sputtering. During the reactive sputtering, $N_2$, $O_2$, or a mixture thereof, may be used as a reactant gas. For example, an inert gas, such as argon (Ar), may be used as the reactant gas. In general, any suitable method may be used to deposit the gate insulating layer 30.

Figure 4:
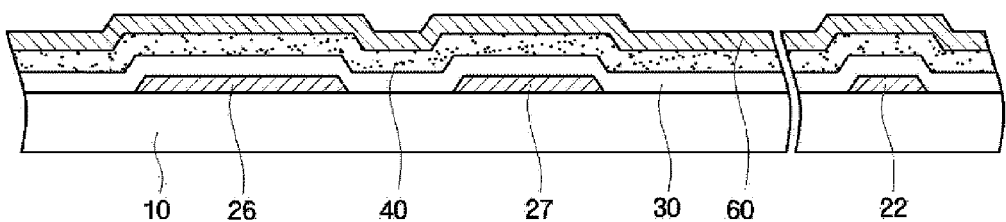

Referring to FIG. 4, an oxide active layer 40 including the first substance may be formed on the gate insulating layer 30 by depositing an oxide of the first substance using, for example, a reactive sputtering process.

Next, a conductive film for data wiring 60, including the second substance and the third substance, may be deposited on the oxide active layer 40 using, for example, a sputtering process.

Figure 5:
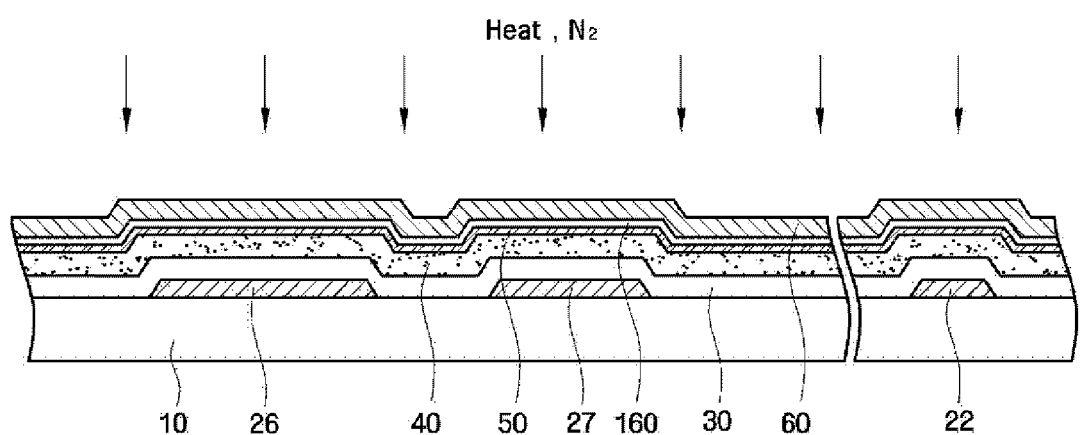

Referring to FIG. 5, the conductive film for data wiring 60, including the second substance and the third substance, and the oxide active layer 40 may be subjected to heat treatment. The heat treatment may result in formation of an oxide layer 160, which may include the third substance and the conductive film. In this case, the heat treatment may be performed in a nitrogen ($N_2$) atmosphere. After the heat treatment, the conductive film for data wiring 60 may also include the third substance.

The oxide formation free energy of the third substance may be smaller than that of the first substance and/or the second substance. Thus, the oxygen contained in the oxide active layer 40 may be combined with the third substance to form the third substance oxide layer 160. A portion of the oxide active layer 40 may become electrically conductive due to oxygen vacancy and may become an ohmic contact layer 50.

Referring to FIG. 14A, before the heat treatment, the ohmic contact layer 50 may exist between the conductive film for data wiring 60 and the oxide active layer 40. Thus, it may be difficult for electric charges to move from the conductive film for data wiring 60 to the oxide active layer 40.

Referring to FIG. 14B, after the heat treatment, the ohmic contact layer 50 may be formed on the oxide active layer 40 and an energy band gap between the conductive film for data wiring 60 and the oxide active layer 40 may be reduced, thereby causing charge tunneling from the conductive film for data wiring 60 to the oxide active layer 40.

Figure 6:
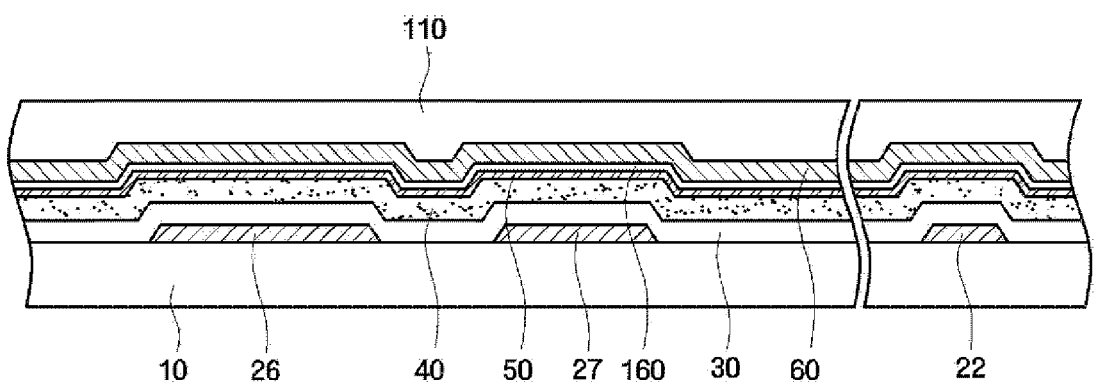

Next, referring to FIG. 6, a photoresist film 110 may be coated on the conductive film for data wiring 60.

Figure 7:
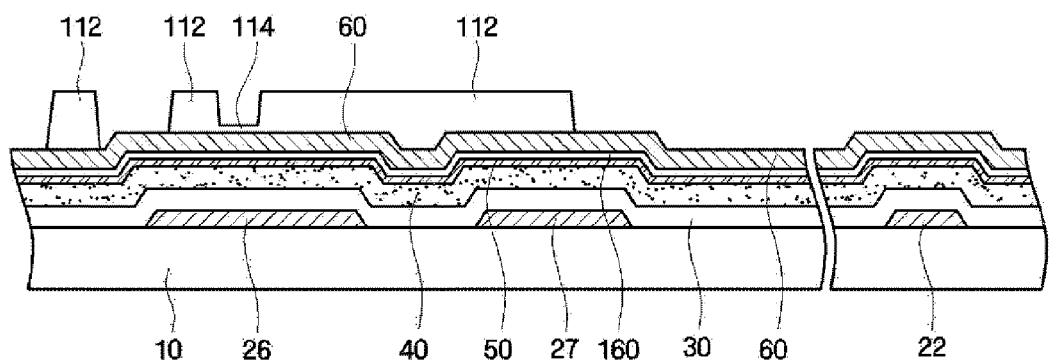

Referring to FIG. 6 and FIG. 7, light may be irradiated onto the photoresist film 110 using a mask, thereby forming photoresist film patterns 112 and 114. The photoresist film pattern 114 may be positioned at the TFT channel region (i.e., between a source electrode (65 of FIG. 10) and a drain electrode (66 of FIG. 10)), and may be shallower (i.e., smaller height) than the photoresist film pattern 112 positioned at a data wiring region. Then, the photoresist film positioned at portions other than the channel region and the data wiring region may be etched away. A thickness ratio of the photoresist film pattern 114 remaining in the channel region to the photoresist film pattern 112 remaining in the data wiring region may vary according to processing conditions of an etching process, which shall be described in further detail below.

As described above, the photoresist film may have a position-dependent thickness. Various methods may be used to adjust the thicknesses of the photoresist film patterns 112 and 114. For example, slits or lattice shapes can be used to control the amount of irradiated light, or a semitransparent layer can be used. The thin photoresist film pattern 114 may be made of a photoresist film that enables reflow, and may be exposed using a conventional mask divided into a portion that fully allows the transmission of light and another portion that fully blocks the transmission of light. Reflow may be performed so that parts of the photoresist film flow to areas where no photoresist film remains.

Figure 8:
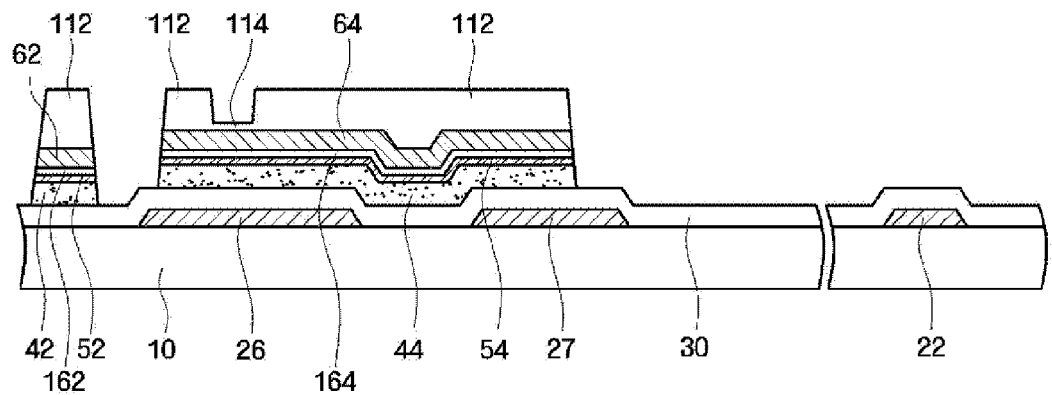

Referring to FIG. 7 and FIG. 8, the conductive film for data wiring 60 may be etched using the photoresist film patterns 112 and 114 as etching masks. The etching may be performed by dry etching, wet etching, or, in general, using any suitable method. In wet etching, a mixed etchant containing a mixed solution of phosphoric acid, a nitric acid, and an acetic acid, and a mixed solution of hydrofluoric acid and deionized water, may be used. Accordingly, in wet etching, only the data line 62 and the conductive film pattern 64 for source/drain electrodes remain while the conductive film for data wiring 60 at portions other than the data line portion and the conductive film pattern portion may be etched away.

The shape of the resultant structure having the data line 62 and the conductive film pattern 64 is identical to that of the data wiring (62, 65, 66, and 67 of FIG. 10) except that the source electrode 65 (see FIG. 10) and the drain electrode 66 (FIG. 10) of the remaining conductive film patterns 62 and 64 are still connected to each other.

Figure 9:
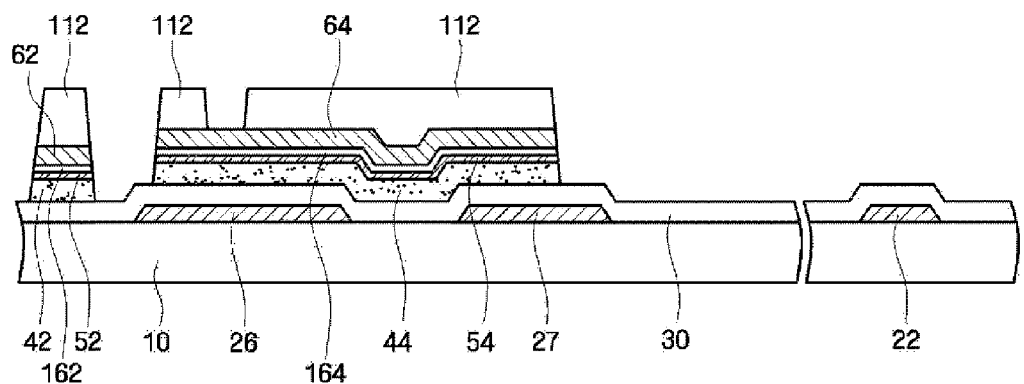

Referring to FIG. 8 and FIG. 9, the photoresist film patterns 112 and 114 are etched back to remove the photoresist film pattern 114 in the channel region. The remaining portion of the photoresist film 114 on a surface of the exposed conductive film pattern 64 may be removed by an ashing process.

Figure 10:
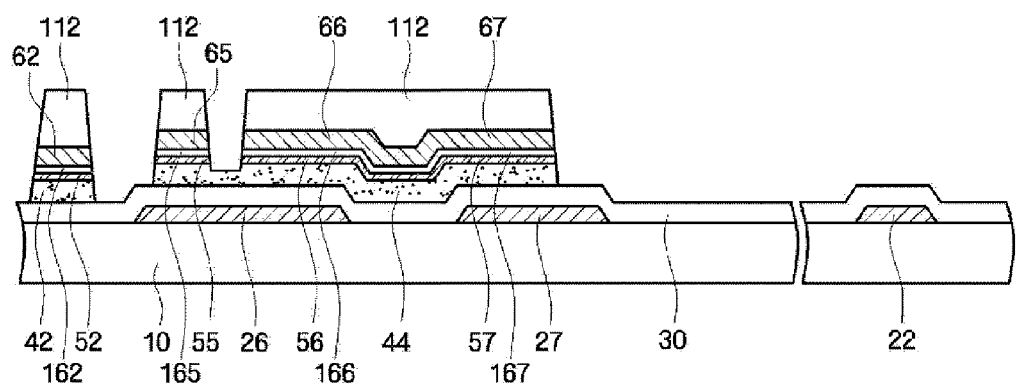

Next, referring to FIG. 9 and FIG. 10, the conductive film pattern 64 exposed as a result of the etch-back process may be removed by wet etching or dry etching. The wet etching may be performed using a mixed etchant that contains a mixed solution of phosphoric acid, a nitric acid, and an acetic acid, and a mixed solution of hydrofluoric acid and deionized water. The etching process may separate the source electrode 65 and the drain electrode 66 thereby completing formation of the photoresist film pattern 112, as illustrated in FIG. 10. Next, the third substance oxide layer 160 and the ohmic contact layer 50 may be etched using the photoresist film pattern 112 as an etch mask, thereby forming the barrier layer patterns 162, 165, 166, and 167 and the ohmic contact layer patterns 52, 55, 56, and 57.

During etching of the third substance oxide layer 160 and the ohmic contact layer 50, part of the oxide active layer pattern 44 may also be removed. However, selective etching of only the oxide active layer pattern 44 without etching the gate insulating layer 30 may be desirable. The etching may be performed by wet etching or dry etching. A mixed etchant containing deionized water mixed with hydrochfluoric acid (HF), sulfuric acid, chloric acid, or a combination of the same may be used in the wet etching. The dry etching may be performed using a fluorine (F)-based etching gas. For example, an etching gas containing a fluorine (F)-based etching gas mixed with Argon (Ar) or Helium (He) may be used for dry etching. In addition, part of the oxide active layer pattern 44 positioned at the channel region may be removed to a predetermined thickness.

In some cases, the oxide active layer patterns 42 and 44, the data wiring 62, 65, 66, and 67, and the barrier layer patterns 162, 165, 166, and 167 may be formed in the following manner. First, the oxide active layer 40 and the conductive film for data wiring 60 may be formed on the gate wiring 22, 26, 27, and 28 and the gate insulating layer 30. Then, the conductive film for data wiring 60 and the oxide active layer 40 may be etched to form the data wiring 62, 65, 66, and 67 and the oxide active layer patterns 42 and 44. Next, the data wiring 62, 65, 66, and 67 and the oxide active layer patterns 42 and 44 may be subjected to heat treatment, thereby forming the barrier layer patterns 162, 165, 166 and 167 made of a third substance oxide. In other words, the order of etching and heat treatment may be reversed. Alternatively, the heat treatment may not be separately performed. Rather, natural heat treatment may be performed using heat applied during the formation step of the passivation layer 70.

Referring back to FIG. 10 and FIG. 11, the remaining portion of the photoresist film pattern 112 on the data wiring 62, 65, 66, and 67 may be removed.

Figure 11:
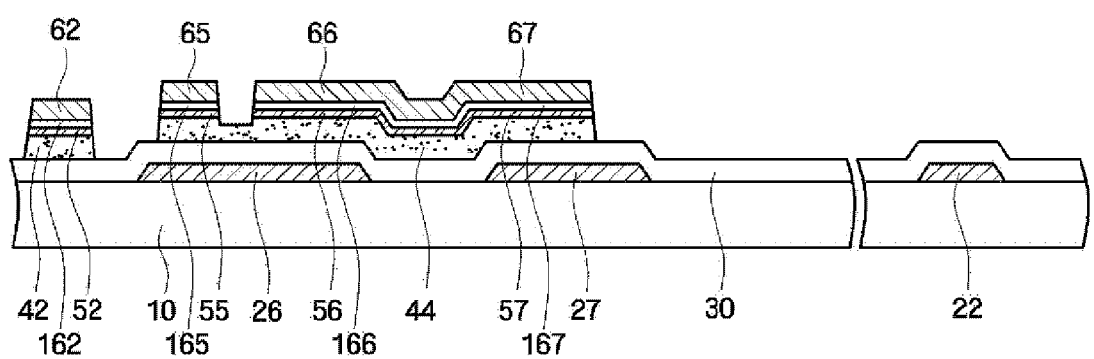

Referring to FIG. 11 and FIG. 12, the passivation layer 70 may be formed on the oxide active layer patterns 42 and 44 and the data wiring 62, 65, 66, and 67. The passivation layer 70 may be formed in the same manner as the gate insulating layer 30.

Subsequently, as shown in FIG. 13, the passivation layer 70 may be etched in a photolithography process to form a contact hole 77 exposing the drain electrode pad 67.

Finally, a transparent conductor, such as ITO or IZO, or a reflective conductor may be deposited and then etched in a photolithography process. Consequently, the pixel electrode 82 connected to the drain electrode pad 67 may be formed, thereby completing the TFT substrate shown in FIG. 2.

Hereinafter, a TFT substrate according to some exemplary embodiments of the present invention will be described in detail with reference to FIG. 15. FIG. 15 is a cross-sectional view of a TFT substrate according to exemplary embodiments of the present invention. A description of similar components/elements that have already been described above will not be repeated, and variations relative to the TFT of FIG. 2 will be described in further detail below.

Referring to FIG. 15, the TFT may include additional barrier layer patterns 1162, 1165, 1166, and 1167 formed on data wiring 62, 65, 66, and 67.

The additional barrier layer patterns 1162, 1165, 1166, and 1167 may be made of the same material as the barrier layer patterns 162, 165, 166 and 167. For example, additional barrier layer patterns 1162, 1165, 1166, and 1167 may be made of a third substance oxide.

A passivation layer 70 may be formed on the additional barrier layer patterns 1162, 1165, 1166, and 1167. The passivation layer 70 may include an oxide in direct contact with the additional barrier layer patterns 1162, 1165, 1166, and 1167. In some cases, the passivation layer 70 may have a double layered structure including an oxide layer directly contacting the additional barrier layer patterns 1162, 1165, 1166, and 1167, and a nitride layer positioned thereabove.

In some cases, ohmic contact layer patterns may not be formed as opposed to the TFT substrate in FIG. 2 which includes ohmic contact layer patterns 52, 55, 56, and 57.

Next, a method of fabricating a TFT substrate according to some exemplary embodiments of the present invention will be described in detail with reference to FIG. 16. FIG. 16 is a cross-sectional view illustrating a method of fabricating a TFT substrate according to some exemplary embodiments of the present invention.

First, the gate wiring 22, 26, 27, and 28, the gate insulating layer 30, the oxide active layer 40, and the conductive film for data wiring 60 including the second substance and the third substance may be formed using the steps shown in FIG. 3 and FIG. 4, as described above.

Referring to FIG. 16, the conductive film for data wiring 60 and the oxide active layer 40 may be subjected to heat treatment, thereby forming the oxide layer 160 made of the third substance. In this case, the conductive film for data wiring 60 may include only the second substance, or may further include the third substance. The heat treatment may be performed in an oxygen atmosphere. Accordingly, the third substance oxide layer 160 may be formed as a result of the reaction of the third substance with oxygen injected into a chamber, instead of oxygen being present in the oxide active layer 40. In addition, while the third substance oxide layer 160 is formed, an additional barrier layer 1160 made of a third substance oxide may further be formed. The additional barrier layer 1160 may be formed by the reaction of the third substance with oxygen applied during the heat treatment.

Next, the TFT substrate shown in FIG. 15 is completed using the steps shown in FIG. 6 through FIG. 13.

Hereinafter, a TFT substrate according to some exemplary embodiments of the invention will be described in detail with reference to FIG. 17 and FIG. 18. FIG. 17 is a layout view of a TFT substrate, and FIG. 18 is a cross-sectional view taken along line B-B' of the TFT substrate shown in FIG. 17.

Gate insulating layers 31 and 32 may be disposed between an insulating substrate 10 and barrier patterns 2162, 2165, 2166, and 2167, and between the gate wiring 22, 26, 27, and 28 and an oxide active layer pattern 45.

The gate insulating layers 31 and 32 may include an oxide in direct contact with the barrier patterns 2162, 2165, 2166, and 2167, which shall be described in further detail below. The gate insulating layers 31 and 32 may include a first gate insulating layer 31 formed on the insulating substrate 10, and a second gate insulating layer 32 formed in direct contact with the barrier patterns 2162, 2165, 2166, and 2167 and positioned under bottom surfaces of data wiring 62, 65, 66, and 67.

The first gate insulating layer 31 may be made of nitride (e.g., $SiN_x$), and the second gate insulating layer 32 may be made of an oxide (e.g., $SiO_x$). The oxide may facilitate formation of the barrier patterns 2162, 2165, 2166, and 2167 including a third substance oxide.

An oxide active layer pattern 45 may be formed on the gate insulating layers 31 and 32. The oxide active layer pattern 45 may be made of an oxide including a first substance. Component materials of the oxide active layer pattern 45 are the same as those of the oxide active layer pattern described above with reference to FIG. 2. The oxide active layer pattern 45 may be formed in an island-type formation in which the oxide active layer pattern 45 may overlap portions of a gate electrode 26, a source electrode 65, and a drain electrode 66. Ohmic contact layer patterns 55' and 56', which are spaced apart from and opposite to each other, may be formed on the oxide active layer pattern 45. The ohmic contact layer patterns 55' and 56' may be disposed between the oxide active layer pattern 45 and the source electrode 65, and between the oxide active layer pattern 45 and the drain electrode 66 to reduce contact resistance therebetween. If the contact resistance is relatively low, the ohmic contact layer patterns 55' and 56' may not be formed.

As described above, the ohmic contact layer patterns 55' and 56' may be formed by removing some oxygen ions in the oxide active layer pattern 45.

The data wiring 62, 65, 66, and 67 may subsequently be formed on the ohmic contact layer patterns 55' and 56' and the gate insulating layers 31 and 32.

The data wiring 62, 65, 66, and 67 may have a single layered structure including a second substance or a multilayered structure including the second substance and a third substance. The second substance may be a low resistivity material (e.g., Cu). The third substance may include an element having a larger out-diffusion coefficient than the first substance or the second substance, so that the element of the third substance may migrate to outer portions of the data wiring 62, 65, 66, and 67. Examples of the third substance may include, but are not limited to, Mn. The third substance may be included in the barrier patterns 2162, 2165, 2166, and 2167, which shall be described in further detail below. In order to reduce the specific resistivity of the data wiring 62, 65, 66, and 67, minimal amounts of the third substance may remain in the data wiring 62, 65, 66, and 67.

The oxide active layer pattern 45 or the ohmic contact layer patterns 55' and 56' may not be disposed between the data wiring 62, 65, 66, and 67 positioned at portions other than portions below the source electrode 65, the drain electrode 66, and the gate insulating layers 31 and 32.

The barrier patterns 2162, 2165, 2166, and 2167 may enclose a top surface, a bottom surface, and lateral surfaces of the data wiring 62, 65, 66, and 67, and may include a third substance oxide. The barrier patterns 2162, 2165, 2166, and 2167 may be disposed between the bottom surface 65a of the source electrode 65 and the oxide active layer pattern 45 or the ohmic contact layer patterns 55' and 56', between the lateral surface 65b of the source electrode 65 and passivation layers 71 and 72, and between the top surface 65c of the source electrode 65 and passivation layers 71 and 72. The barrier patterns 2162, 2165, 2166, and 2167 positioned between the bottom surface 65a of the source electrode 65 and the oxide active layer pattern 45 or the ohmic contact layer patterns 55' and 56' may include oxygen ions in the oxide active layer pattern 45, and an oxide combined with the third substance. The barrier patterns 2162, 2165, 2166, and 2167 positioned between the lateral surface 65b and the passivation layers 71 and 72, and between the top surface 65c of the source electrode 65 and the passivation layers 71 and 72 may include oxygen ions in the first passivation layer 71 and an oxide combined with the third substance. The barrier patterns 2162, 2165, 2166, and 2167 covering top and lateral surfaces of the data line 62 may include oxygen ions in the first passivation layer 71 and an oxide combined with the third substance. The barrier patterns 2162, 2165, 2166, and 2167 covering a bottom surface of the data line 62 may include oxygen ions in the second gate insulating layer 32 and an oxide combined with the third substance.

The third substance in the barrier patterns 2162, 2165, 2166, and 2167 may have a large diffusion coefficient like, for example, an Mn oxide, and may prevent copper (Cu) in the data wiring 62, 65, 66, and 67 from diffusing into the oxide active layer pattern 45. Accordingly, even if the data wiring 62, 65, 66, and 67 has a single layer structure including a second substance, it may be possible to prevent the second substance from diffusing into the oxide active layer pattern 45 while maintaining low resistivity. A TFT substrate having data wiring 62, 65, 66, and 67 with a single layer structure shall be described in further detail below.

The passivation layers 71 and 72 may be formed on the barrier patterns 2162, 2165, 2166, and 2167, the gate insulating layers 31 and 32, and the oxide active layer pattern 45 in a channel region.

The passivation layers 71 and 72 may include an oxide in direct contact with the barrier patterns 2162, 2165, 2166, and 2167. The passivation layers 71 and 72 may include a first passivation layer 71 directly contacting the barrier patterns 2162, 2165, 2166, and 2167 formed on top and lateral surfaces of the data wiring 62, 65, 66, and 67, and a second passivation layer 72 formed on the first passivation layer 71. The first passivation layer 71 may include an oxide (e.g., $SiO_x$), and the second passivation layer 72 may include a nitride (e.g., $SiN_x$).

The passivation layer 71 may be made of an oxide, which may facilitate formation of the barrier patterns 2162, 2165, 2166, and 2167.

Hereinafter, electrical properties of the TFT substrate described with reference to FIG. 17 and FIG. 18 (i.e., Example 1) shall be described using TABLE 2, FIG. 19, and FIG. 20. FIG. 19 and FIG. 20 are graphs for comparing electrical properties of the TFT substrates according to Example 1, and Comparative Examples 1 and 2.

FIG. 19 is a graphical representation for comparing mobility levels of data wiring 62, 65, 66, and 67 of Example 1 with data wirings of Comparative Examples 1 and 2. The TFT substrate according to Comparative Example 1 may include data wiring having a Cu single layer without barrier patterns 2162, 2165, 2166, and 2167, and the TFT substrate according to Comparative Example 2 may include data wiring having a TiN/Cu double layered structure.

FIG. 20 is a graphical representation for comparing threshold voltages of Example 1, Comparative Example 1, and Comparative Example 2.

The measurement results shown in FIG. 19 and FIG. 20 are listed in TABLE 2.

TABLE 2

| Data wiring | Mobility ($\mu\Omega$cm) | Threshold voltage (V) |
|---|---|---|
| Example 1 | 4.8 | −3.2 |
| Comparative Example 1 | 0.87 | −7.9 |
| Comparative Example 2 | 3.3 | −10.5 |

As shown in FIG. 19, FIG. 20, and TABLE 2, the TFT substrate according to Example 1, which includes the data wiring 62, 65, 66, and 67 having a Cu single layer and barrier patterns 2162, 2165, 2166, and 2167 made of an Mn oxide, has a mobility higher than that of Comparative Examples 1 or 2.

A threshold voltage level (Vth) of Example 1 is closer to zero, while threshold voltage levels of Comparative Examples 1 and 2 are more negative.

Hereinafter, a method of fabricating a TFT substrate according to some exemplary embodiments of the present invention will be described in detail with reference to FIG. 21, FIG. 22, and FIG. 23. FIG. 21 and FIG. 23 are cross-sectional views illustrating a method of fabricating a TFT substrate according to some exemplary embodiments of the present invention.

Referring to FIG. 21, gate wiring 22, 26, 27, and 28 may be formed on an insulating substrate 10. Next, gate insulating layers 31 and 32 may be formed on the gate wiring 22, 26, 27, and 28.

The gate insulating layers 31 and 32 may include a first gate insulating layer 31 and a second gate insulating layer 32. The first gate insulating layer 31 may be made of a nitride and a second gate insulating layer 32 may be made of an oxide. The first gate insulating layer 31 and the second gate insulating layer 32 may be sequentially formed on the insulating substrate 10.

Next, an oxide active layer pattern 45 including a first substance may be formed on the second gate insulating layer 32. The oxide active layer pattern 45 may overlap the gate electrode 26.

Referring to FIG. 22, the data wiring 62, 65, 66, and 67 may include a single layer containing a second substance. A third substance may be formed on the oxide active layer pattern 45 to cross the gate wiring 22, 26, 27, and 28.

The data wiring 62, 65, 66, and 67 may directly contact the second gate insulating layer 32, the oxide active layer pattern 45, or the ohmic contact layer patterns 55' and 56'. The third substance may have a larger diffusion coefficient than the second substance. For example, the second substance may be copper (Cu), and the third substance may be manganese (Mn). About 1% to 4% of the second substance may be Mn.

Since the data wiring 62, 65, 66, and 67 has a single layered structure, the number of data wiring formation steps may not be increased, thereby increasing the processing efficiency. For example, if the data wiring 62, 65, 66, and 67 has a Mn/Cu single layered structure, the data wiring 62, 65, 66, and 67 may be deposited using, for example, a sputtering process. In such cases, a deposition rate of the data wiring 62, 65, 66, and 67 may be about 4400 Å/min, which is faster than that of the data wiring having a Ti/Cu double layered structure (i.e., about 3800 Å/min) indicating that the data wiring 62, 65, 66, and 67 having a Mn/Cu single layered structure may provide better/improved processing efficiency.

Referring to FIG. 23, the passivation layers 71 and 72 including an oxide may be formed to directly contact top and lateral surfaces of the data wiring 62, 65, 66, and 67 including the second substance and the third substance.

The passivation layers 71 and 72 may be formed using a chamber maintained at a temperature of about 200° C. to 350° C. through a PECVD or reactive sputtering process. In such cases, the data wiring 62, 65, 66, and 67 may be subject to heat treatment using heat applied when the passivation layers 71 and 72 are formed.

The passivation layers 71 and 72 may include a first passivation layer 71 and a second passivation layer 72. Forming the passivation layers 71 and 72 includes sequentially forming the first passivation layer 71 and the second gate insulating layer 32. The first passivation layer 71 may directly contact the top and lateral surfaces of the data wiring 62, 65, 66, and 67 and may be made of an oxide. The second gate insulating layer 32 may be formed on the first passivation layer 71 and may be made of a nitride. The first passivation layer 71 may be formed at a high temperature in an oxygen atmosphere. Accordingly, the data wiring 62, 65, 66, and 67 may be treated thermally, so that the third substance in the data wiring 62, 65, 66, and 67 is out-diffused to form the barrier patterns 2162, 2165, 2166, and 2167 covering top, bottom and lateral surfaces of the data wiring 62, 65, 66, and 67. Since the third substance may have a larger out-diffusion coefficient than the first or second substance, the third substance may out-diffuse to the data wiring 62, 65, 66, and 67 faster than the first or second substance, and may react with oxygen ions in the oxide in contact with the data wiring 62, 65, 66, and 67 to form third substance oxide. After heat treatment, only the second substance may remain in the data wiring 62, 65, 66, and 67. If diffusion of the third substance is not complete, portions of the third substance may remain in the data wiring 62, 65, 66, and 67.

After the deposition and before the formation of the passivation layers 71 and 72, a specific resistivity of the data wiring 62, 65, 66, and 67 may be about 14.9 μΩcm, which is relatively high. However, after the heat treatment, the specific resistivity may be about 2.3 μΩcm, which is substantially the same as that of Cu. As a result of using heat treatment to form the passivation layers 71 and 72, only Cu may remain in the data wiring 62, 65, 66, and 67 indicating that the specific resistivity of the data wiring 62, 65, 66, and 67 may be improved.

Accordingly, in the TFT substrate described with reference to FIG. 21, FIG. 22, and FIG. 23, the data wiring 62, 65, 66, and 67 may have a single layered structure, and the data wiring formation time does not increase. Further, since the heat treatment for the data wiring 62, 65, 66, and 67 is also performed at the same time when forming the passivation layers 71 and 72, no additional processing time may be necessary. In addition, a Cu proportion in the data wiring 62, 65, 66, and 67 may be increased to form the barrier patterns 2162, 2165, 2166, and 2167, while reducing the specific resistivity, thereby preventing diffusion of component substances of the data wiring 62, 65, 66, and 67. Thus, the device reliability can be improved.

Referring to FIG. 18, a contact hole 77 may be formed in the passivation layers 71 and 72 to expose the drain electrode pad 67. In this case, the barrier patterns 2162, 2165, 2166, and 2167 exposed through the contact hole 77 may also be removed.

A pixel electrode 82 may be formed on the passivation layers 71 and 72. The drain electrode pad 67 may then be in contact with the pixel electrode 82.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor substrate, comprising:
   gate wiring disposed on a substrate;
   oxide active layer patterns disposed on the gate wiring, the oxide active layer patterns comprising a first substance;
   data wiring disposed on the oxide active layer patterns and crossing the gate wiring, the data wiring comprising a second substance;
   barrier layer patterns formed between the oxide active layer patterns and the data wiring, the barrier layer patterns comprising a third substance; and
   ohmic contact layer patterns disposed between the oxide active layer patterns and the barrier layer patterns,
   wherein the ohmic contact layer patterns and the oxide active layer patterns comprise the same elements, with the ohmic contact layer patterns having a lower oxygen content than the oxide active layer patterns, and
   wherein the data wiring comprises:
      a first layer disposed on the oxide active layer patterns and comprising an alloy of the second substance and the third substance; and
      a second layer disposed on the first layer and comprising the second substance.

2. The thin film transistor substrate of claim 1, wherein an oxide formation free energy of the third substance is smaller than an oxide formation free energy of the first substance and an oxide formation free energy of the second substance.

3. The thin film transistor substrate of claim 1, wherein the data wiring further comprises the third substance.

4. The thin film transistor substrate of claim 1, wherein the first substance comprises one or more elements selected from the group consisting of Zinc, Indium, Tin, Gallium, and Hafnium.

5. The thin film transistor substrate of claim 1, wherein the second substance comprises an element selected from the group consisting of Silver, Aluminum, and Copper, and
   wherein the third substance comprises one or more elements selected from the group consisting of Vanadium, Titanium, Zirconium, Tantalum, Manganese, Magnesium, Chromium, Molybdenum, Cobalt, and Niobium.

6. The thin film transistor substrate of claim 5, wherein the data wiring comprises a third layer disposed on the second layer, the third layer comprising an alloy of the second substance and the third substance.

7. The thin film transistor substrate of claim 6, wherein one or both of the first and third layers comprises about 96% to 99% of the second substance and about 1% to 4% of the third substance.

8. The thin film transistor substrate of claim 1, further comprising additional barrier layer patterns disposed on the data wiring, the additional barrier layer patterns comprising an oxide of the third substance.

9. The thin film transistor substrate of claim 8, further comprising a passivation layer comprising an oxide in direct contact with the additional barrier layer patterns.

10. The thin film transistor substrate of claim 9, wherein the oxide active layer patterns further comprises a nitride.

* * * * *